US012582007B2

(12) United States Patent
Davies et al.

(10) Patent No.:    US 12,582,007 B2
(45) Date of Patent:        Mar. 17, 2026

(54) INTEGRATING INPUT AND OUTPUT CAPACITANCE WITH HIGH FREQUENCY SHUNT CAPACITANCE ON A SINGLE ADDITIVELY MANUFACTURED SUBSTRATE

(71) Applicant: Rockwell Collins, Inc., Cedar Rapids, IA (US)

(72) Inventors: Orion D. Davies, Cedar Rapids, IA (US); Haley M. Steffen, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 423 days.

(21) Appl. No.: 18/131,998

(22) Filed: Apr. 7, 2023

(65) Prior Publication Data

US 2024/0339442 A1      Oct. 10, 2024

(51) Int. Cl.
H01L 23/64        (2006.01)
H01L 23/498      (2006.01)
H01L 23/552      (2006.01)
H01L 25/16        (2023.01)

(52) U.S. Cl.
CPC ...... H01L 25/165 (2013.01); H01L 23/49827 (2013.01); H01L 23/49838 (2013.01); H01L 23/552 (2013.01)

(58) Field of Classification Search
CPC .............................. H01L 23/642; H01L 23/66
See application file for complete search history.

(56) References Cited

U.S. PATENT DOCUMENTS

| | | | | |
|---|---|---|---|---|
| 5,636,099 | A | * | 6/1997 | Sugawara .............. H05K 1/162 |
| | | | | 361/278 |
| 7,203,923 | B2 | | 4/2007 | Tung et al. |
| 8,487,406 | B2 | | 7/2013 | Darabi et al. |
| 8,595,924 | B2 | | 12/2013 | McKinzie, III |
| 10,491,181 | B2 | | 11/2019 | Kishimoto |

(Continued)

FOREIGN PATENT DOCUMENTS

| | | | | |
|---|---|---|---|---|
| JP | 2005277389 | A | * | 10/2005 |
| JP | 2007088363 | A | * | 4/2007 |

OTHER PUBLICATIONS

European Search Report received in EP Application No. 24168992. 6, Sep. 12, 2024, 11 pages.

*Primary Examiner* — Michele Fan
(74) *Attorney, Agent, or Firm* — Suiter Swantz IP

(57)        ABSTRACT

A package is described. The package includes a die covered by a lid. The lid maintains a hermetic seal for the die. The package includes high frequency shunt capacitance in parallel with surface-mount capacitors. The high frequency shunt capacitance is formed by interdigital capacitors below the surface-mount capacitors. The interdigital capacitors, the surface-mount capacitors, and the die form a circuit which produces a stable output voltage. The output voltage may remain stable even when subject to noise due to energized particles in space. The package includes solder resist with openings for attaching the surface-mount capacitors to the interdigital capacitors. Advantageously, the interdigital capacitors may achieve high frequency shunt capacitance on the order of nano-farads as part of the frame geometry with minimal increase in package height.

17 Claims, 10 Drawing Sheets

(56)     References Cited

U.S. PATENT DOCUMENTS

| | | | |
|---|---|---|---|
| 11,223,336 B2 | 1/2022 | Fu et al. | |
| 11,373,976 B2 | 6/2022 | Lower et al. | |
| 11,387,863 B1 | 7/2022 | Davies et al. | |
| 11,533,028 B2 | 12/2022 | Wang et al. | |
| 2001/0035746 A1 | 11/2001 | Burstein et al. | |
| 2002/0050873 A1 | 5/2002 | Tsunoda et al. | |
| 2002/0105395 A1* | 8/2002 | Tajima | H01P 1/20381 |
| | | | 333/245 |
| 2003/0222732 A1 | 12/2003 | Matthaei | |
| 2019/0229618 A1 | 7/2019 | Parto | |
| 2021/0159166 A1* | 5/2021 | Oikawa | H10D 1/692 |

* cited by examiner

INTEGRATING INPUT AND OUTPUT CAPACITANCE WITH HIGH FREQUENCY SHUNT CAPACITANCE ON A SINGLE ADDITIVELY MANUFACTURED SUBSTRATE

TECHNICAL FIELD

The present invention generally relates to semiconductor device packaging, and more specifically to capacitive arrangements.

BACKGROUND

Point-of-load (POL) converters are used to step down an input power to an output power usable by a load. Excessive noise on the input of the POL converters translates to noise on the output. Maintaining a steady output voltage is typically desirable, such that the noise on the inputs and output is undesirable.

The POL converters may be used in a number of environments, such as a space or orbital environment. The input and output noise may be induced by energizing particles from space. Volume, weight, and power efficiency are at a premium in orbital systems. In particular, a footprint or form factor of the POL converters may be limited. Therefore, it would be advantageous to provide a device, system, and method that cures the shortcomings described above.

SUMMARY

A package is described, in accordance with one or more embodiments of the present disclosure. In some embodiments, the package includes a substrate. In some embodiments, the package includes a ground plane. In some embodiments, the package includes an input node. In some embodiments, the package includes an output node. In some embodiments, the package includes a semiconductor die electrically coupled between the input node and the output node. In some embodiments, the package includes a first conductive structure electrically coupled to the ground plane. The first conductive structure comprises a first comb and a first plurality of fingers. The first plurality of fingers each extend from the first comb. The first comb and the first plurality of fingers are disposed on the substrate. In some embodiments, the package includes a second conductive structure electrically coupled to the output node. The second conductive structure comprises a second comb and a second plurality of fingers. The second plurality of fingers each extend from the second comb. The second comb and the second plurality of fingers are disposed on the substrate. The first plurality of fingers is interdigitated with the second plurality of fingers to form a first interdigital capacitor. In some embodiments, the package includes a solder resist disposed on the first conductive structure and on the second conductive structure. The solder resist is disposed between the first plurality of fingers and the second plurality of fingers. In some embodiments, the package includes a first surface-mount capacitor disposed on the solder resist. The first surface-mount capacitor is electrically coupled in parallel with the first interdigital capacitor between the output node and the ground plane.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1A:
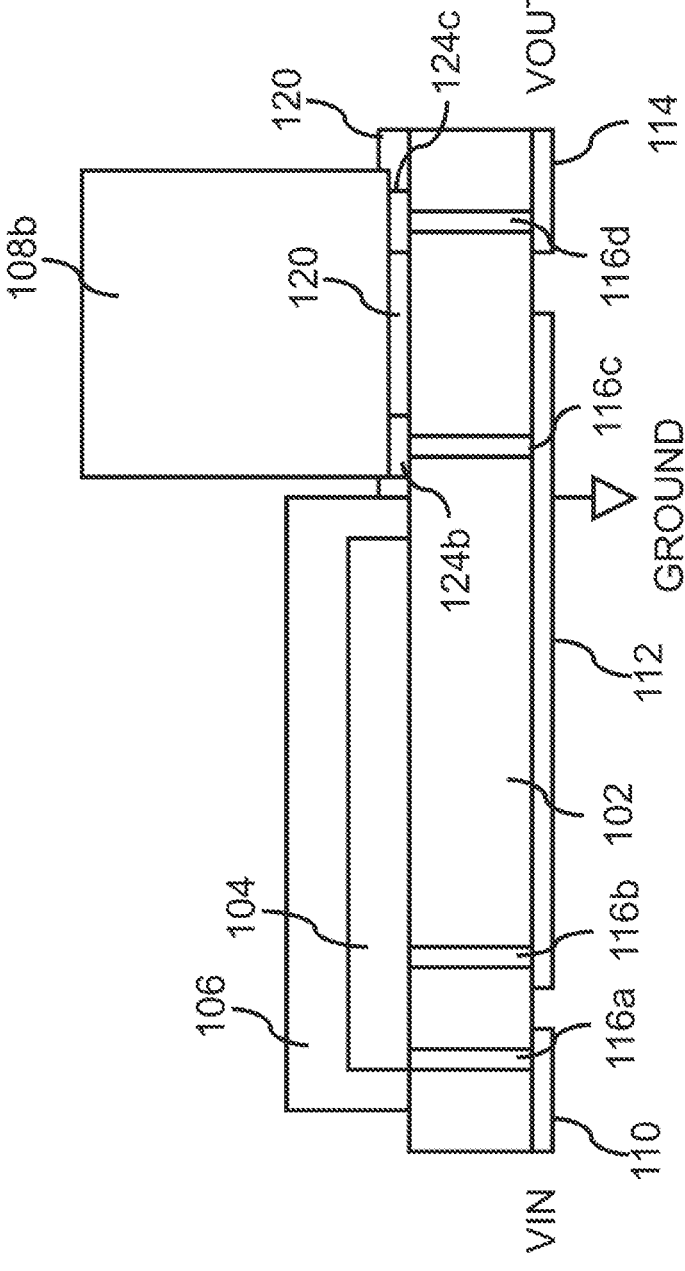
FIG. 1A depicts a cross-section view of a package, in accordance with one or more embodiments of the present disclosure.
Figure 1B:
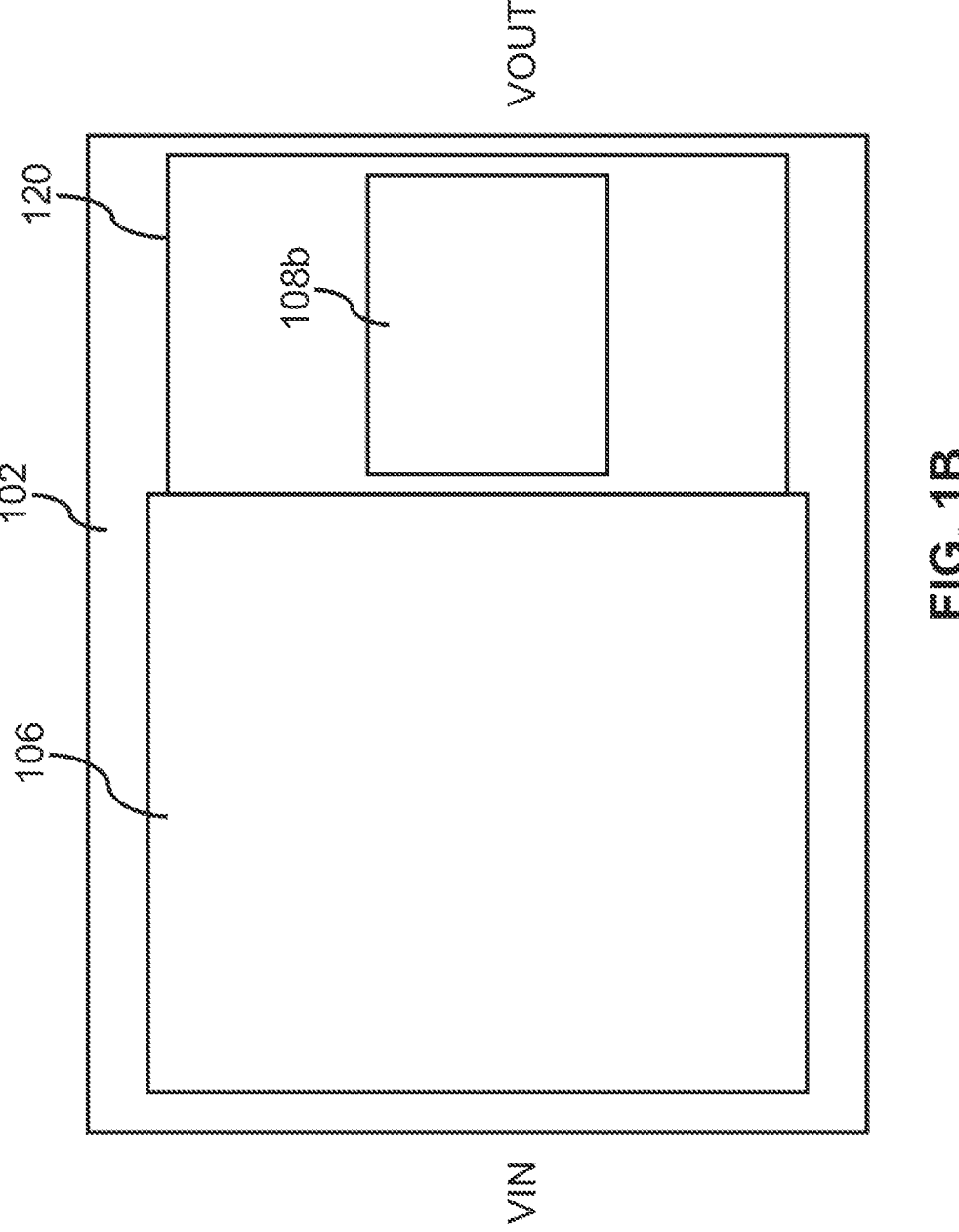
FIG. 1B depicts a top view of a package, in accordance with one or more embodiments of the present disclosure.
Figure 1C:
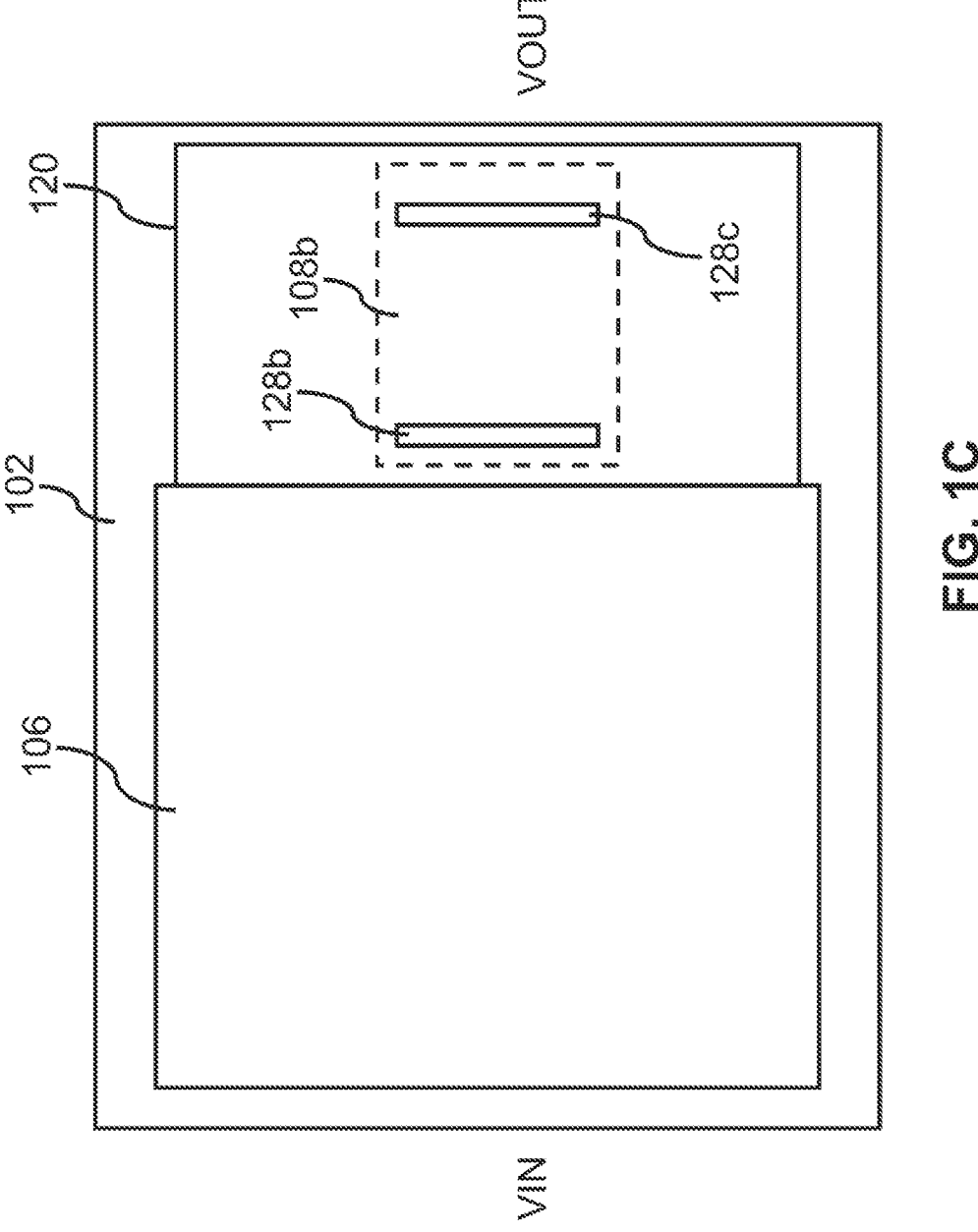
FIG. 1C depicts a top view of a package with a surface-mount capacitor hidden to illustrate openings in a solder resist, in accordance with one or more embodiments of the present disclosure.
Figure 1D:
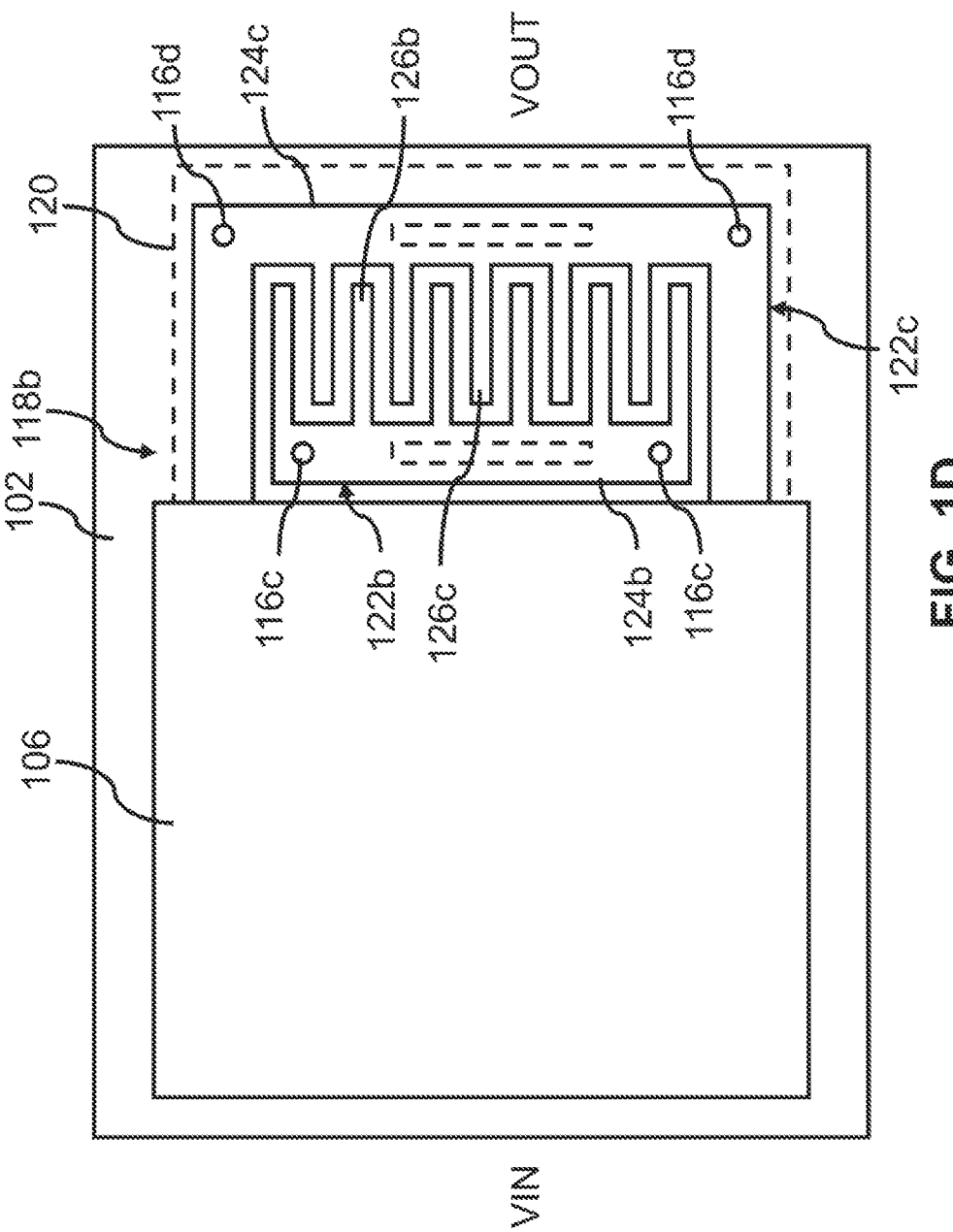
FIG. 1D depicts a top view of a package with a surface-mount capacitor and a solder resist hidden to depict an interdigital capacitor, in accordance with one or more embodiments of the present disclosure.
Figure 2A:
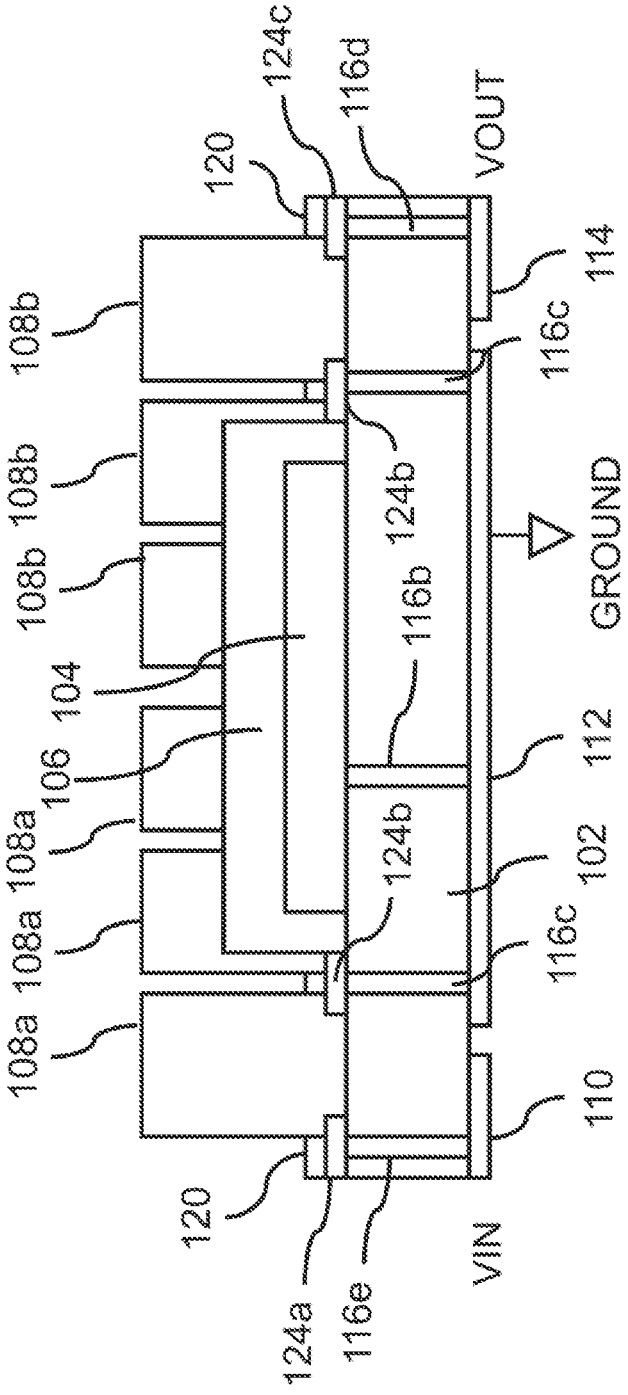
FIG. 2A depicts a cross-section view of a package, in accordance with one or more embodiments of the present disclosure.
Figure 2B:
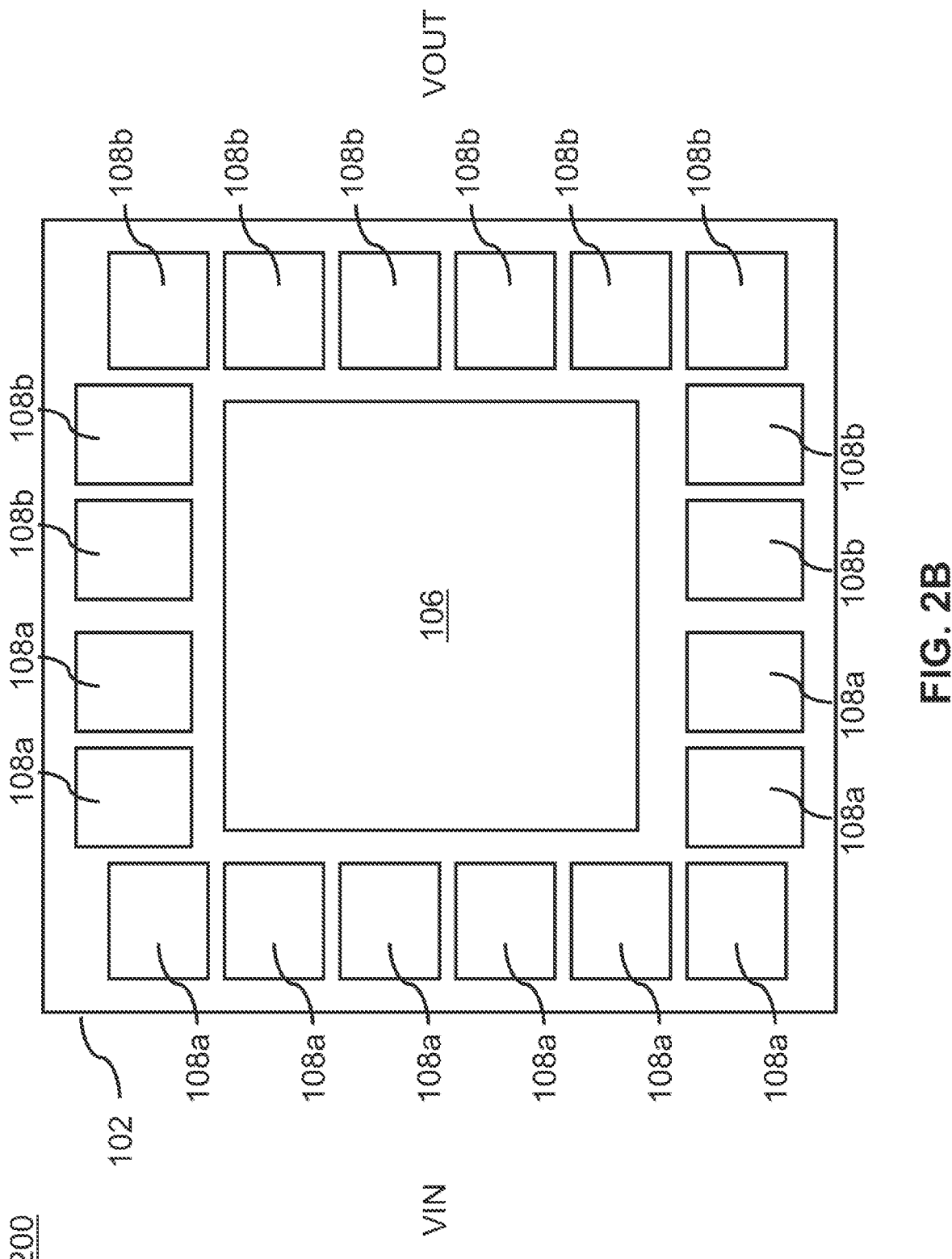
FIG. 2B depicts a top view of a package, in accordance with one or more embodiments of the present disclosure.
Figure 2C:
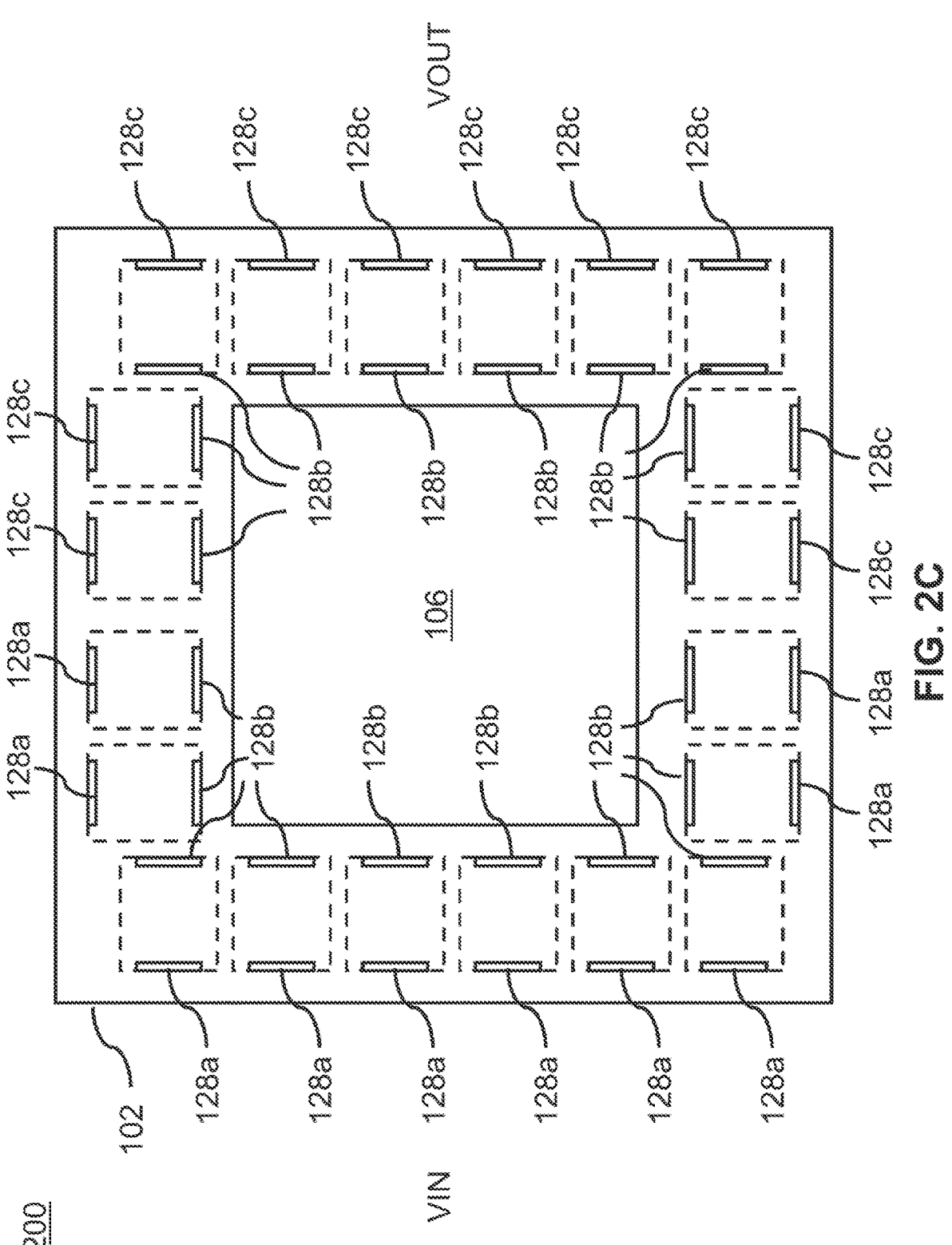
FIG. 2C depicts a top view of a package with surface-mount capacitors hidden to illustrate openings in a solder resist, in accordance with one or more embodiments of the present disclosure.
Figure 2D:
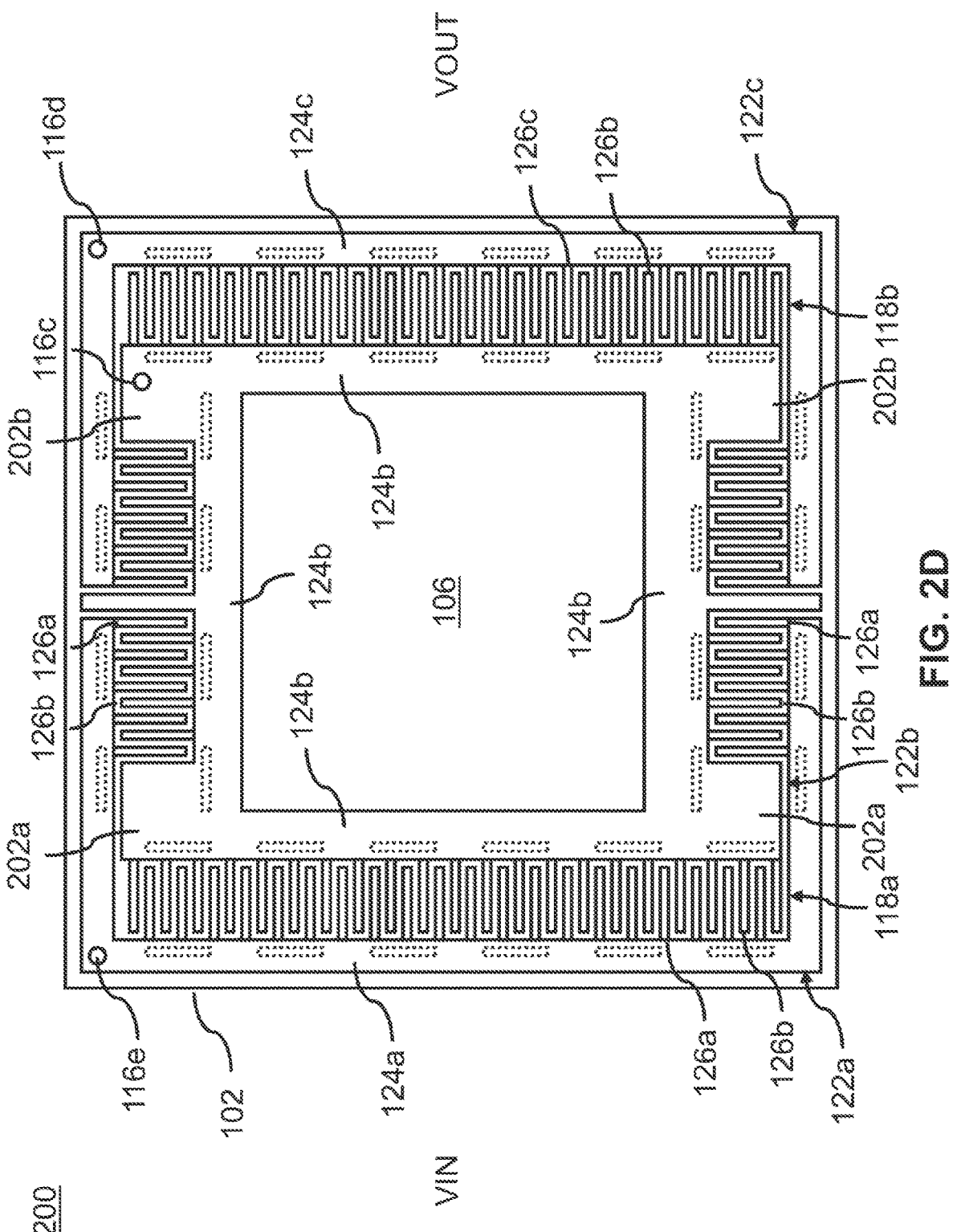
FIG. 2D depicts a top view of a package with surface-mount capacitors and solder resist hidden to depict interdigital capacitors, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings. Embodiments of the present disclosure are generally directed to a package. The package significantly increases the integration density of multiple large input and output capacitors on an additive substrate. The package also provides high frequency shunt capacitance, on the order of nano-farads, as part of the frame geometry created by the additive manufacturing design. The high frequency shunt capacitance filters noise without the need for additional discrete components that occupy additional volume.

Referring to FIG. 1A-1D, a package 100 is described, in accordance with one or more embodiments of the present disclosure. The package 100 may include one or more of substrate 102, die 104, lid 106, surface-mount capacitor 108, input node 110, ground plane 112, output node 114, through-hole vias 116, interdigital capacitor 118, solder resist 120, and the like.

In embodiments, the package 100 may include the substrate 102. The substrate 102 may include a wafer. For example, the substrate 102 may include, but is not limited to, an alumina wafer, a sapphire wafer, a glass wafer, a silicon wafer, an aluminum nitride wafer, a beryllium oxide wafer, an organic wafer, and the like.

In embodiments, the package 100 may include the input node 110. The input node 110 may include a polarity. Voltage at the input node 110 may be referred to as a voltage input (VIN). The input node 110 may receive an input power. The die 104 may be electrically coupled to the input node 110. The input power then goes into the die 104. The input power from the input node 110 may be provided to the die 104 for being conditioning by the die 104. For example, the die 104 may power condition the input power. It is contemplated that the input voltage (VIN) may include, but is not limited to, 5-volts, 28-volts, 48 volts, and the like.

In embodiments, the package 100 may include the ground plane 112. The ground plane 112 may include a polarity which is opposite to the input node 110. The ground plane 112 may also be referred to as ground, reference ground, or reference.

In embodiments, the package 100 may include the output node 114. Voltage at the output node 114 may be referred to as a voltage output (VOUT). The output node 114 may also output an output power. The output power may be referred to as a point of load (POL). For example, the package 100 may be connected to a load (not depicted) by a connection. The connection is intended to be as electrically short as possible to the load that is receiving the power output from the output node 114.

In embodiments, the package 100 may include the die 104. The die 104 may also be referred to as an integrated circuit, an active die, semiconductor die or "die", and/or an active integrated circuit. The die 104 may include an additive frame, passives elements, active elements or components, and the like. The passive elements may also be referred to as passive components or passive structures. The passive elements may include, but are not limited to, resistors, capacitors, inductors, transformers, and the like. The active elements may also be referred to as active components or active structures. The active elements may include, but are not limited to, transistors, diodes, and the like. For example, the diodes may include Field-effect transistors (FETs) with shunt-gate diodes, although this is not intended to be limiting.

In embodiments, the die 104 may be a power converter, power conditioner, switching regulator, or the like. In this regard, the die 104 may receive an input voltage and step down the input voltage at the input node 110 to the output voltage at the output node 114. The input voltage may then be greater than the output voltage and the output voltage may be greater than the input voltage depending on the function of the die. In embodiments the conversion may be done through switching action that introduces high frequency noise that is then attenuated by the high frequency interdigital capacitor structure.

Although the package 100 is depicted as including one of the dies 104, this is not intended as a limitation of the present disclosure. It is contemplated that the package 100 may include multiple of the dies 104.

In embodiments, the package 100 may include one or more of the surface-mount capacitors 108. The surface-mount capacitors 108 may also be referred to as discrete capacitors. The surface-mount capacitors 108 may form a circuit (e.g., circuit 300) with the die 104. The surface-mount capacitor 108 may be selected to meet a specification for the circuit formed by the die 104 and the surface-mount capacitors 108. For example, the surface-mount capacitors 108 may include a capacitance value on the order of ones, tens, or hundreds of microfarads. In some instances, the surface-mount capacitors 108 may include ceramic capacitors, although this is not intended to be limiting.

Although not depicted, the package 100 may include multiple of the surface-mount capacitors 108. The surface-mount capacitors 108 may each be coupled (e.g., electrically coupled) in parallel. For example, the surface-mount capacitors 108 may each be coupled in parallel between the input node 110 and the ground plane 112 such that the package includes multiple of the input surface-mount capacitors 108a. By way of another example, surface-mount capacitors 108 may each be coupled in parallel between the ground plane 112 and the output node 114 such that the package includes multiple of the output surface-mount capacitors 108b. The surface-mount capacitors 108 may be coupled in parallel to achieve an equivalent capacitance value (e.g., sum of capacitance values of surface-mount capacitors 108) for the circuit.

The package 100 may be utilized in one or more applications. For example, the package 100 may be utilized in a satellite application. The satellite application may be disposed in low Earth orbit (LEO) or beyond. The package 100 may be subjected to energized particles (e.g., ionizing radiation) while deployed in space. The energized particles may make the input voltage, the die 104, and/or the output voltage electrically noisy. Although the package 100 is described as being used in satellite applications in space environments, this is not intended as a limitation of the present disclosure. The package 100 may also be used outside of such applications or environments.

In embodiments, the package 100 may include the lid 106. The lid 106 is disposed over and covers the die 104. The lid 106 may include a top portion disposed over the die 104. The lid 106 may also include one or more walls disposed around the die 104 to fully enclose the die 104. The lid 106 may hermetically seal the die 104. The hermetic seal may protect against environmental elements, such as temperature and moisture. The lid 106 may also radiation harden the die 104. For example, the lid 106 may reduce electromagnetic interference the die 104 experience from the energized particles. In this regard, the lid 106 may also be referred to as a shielding layer. The lid 106 may hermetically seal and radiation harden the die 104 for satellite applications in space environments. The radiation hardening may reduce the electrical noise the die 104 experiences. However, the lid 106 may or may not reduce the noise of the input voltage and/or the output voltage.

In embodiments, the surface-mount capacitors 108 may be positioned outside of the lid 106. A size constraint may necessitate leaving the surface-mount capacitors 108 outside of the lid 106. The surface-mount capacitors may include a height or thickness. For example, the surface-mount capacitors 108 may be on the order of several millimeters thick. The height of the surface-mount capacitors 108 may be relatively tall compared to the die 104 and the lid 106. The height of the surface-mount capacitors 108 may be taller than the combination of the die 104 and the lid 106. The height of the lid 106 may also be height constrained, beyond which the lid 106 is unable to be increased. The surface-mount capacitor 108 may thus be unable to be brought within the lid 106 because of the height constraints. In this regard, the surface-mount capacitors 108 may be considered too big to fit within the lid 106.

The surface-mount capacitors 108 may or may not reduce the electrical noise at the input node 110 and/or the output power at the output node 114 may be electrically noisy. For example, the surface-mount capacitors 108 may not reduce electrical noise at high frequencies.

In embodiments, the package 100 include interdigital capacitors 118. The interdigital capacitors 118 may reduce the high frequency electrical noise at the input node 110 and the output node 114.

In embodiments, the surface-mount capacitor 108 and/or the interdigital capacitor 118 may be coupled (e.g., electrically coupled) between the output node 114 and the ground plane 112. The surface-mount capacitor 108 may be considered an output capacitor (e.g., output surface-mount capacitor 108b) by coupling between the output node 114 and the ground plane 112. Similarly, the interdigital capacitor 118 may be considered an output capacitor (e.g., output interdigital capacitor 118b) by coupling between the output node 114 and the ground plane 112.

In embodiments, the surface-mount capacitor 108 and/or the interdigital capacitor 118 may be coupled between the input node 110 and the ground plane 112 (not depicted in FIGS. 1A-1D). The surface-mount capacitor 108 may be considered an input capacitor (e.g., input surface-mount capacitor 108a) by coupling between the output node 114 and the ground plane 112. Similarly, the interdigital capacitor 118 may be considered an input capacitor (e.g., input interdigital capacitor 118a) by coupling between the input node 110 and the ground plane 112.

In embodiments, the surface-mount capacitors 108 and the interdigital capacitors 118 are electrically coupled in parallel. For example, the surface-mount capacitors 108 and the interdigital capacitors 118 may be electrically coupled in parallel between the output node 114 and the ground plane 112. In this regard, the package 100 may include the output surface-mount capacitors 108b and the output interdigital capacitors 118b. By way of another example, the surface-mount capacitors 108 and the interdigital capacitors 118 may be electrically coupled in parallel between the input node 110 and the ground plane 112. In this regard, the package 100 may include the input surface-mount capacitors 108a and the input interdigital capacitors 118a.

In embodiments, the package 100 may include surface-mount capacitors 108 and interdigital capacitors 118 electrically coupled in parallel between the input node 110 and the ground plane 112 and may include surface-mount capacitors 108 and interdigital capacitors 118 electrically coupled in parallel between the output node 114 and the ground plane 112. In this regard, the package 100 may include input surface-mount capacitors 108a, output surface-mount capacitors 108b, input interdigital capacitors 118a, and output interdigital capacitors 118b.

The interdigital capacitor 118 may include a capacitance value. For example, the capacitance value of the interdigital capacitor 118 may be on the order of nano-farads (e.g., between one and ten nano-farads). The capacitance values on the order of nano-farads are desirable for shunting noise for high frequency signals. The capacitance value of the interdigital capacitor 118 may be much lower than the capacitance value of the surface-mount capacitor 108. In embodiments, the interdigital capacitor 118 may shunt away high frequency noise when electrically coupled in parallel with the surface-mount capacitors 108. The interdigital capacitor 118 may shunt away the high frequency noise at the input node 110 and/or at the output node 114. Including the low capacitance (on the order of nano-farads) in parallel or shunt with the large input and output capacitance values may filter the high frequency noise.

The package 100 may achieve a relatively stable output voltage at the output node 114 by shunting away the high frequency noise. For example, the output voltage of the output node 114 may vary from a desired output voltage with a percent error of $1*10^{-6}$ percent (e.g., 1e-6) or less, although this is not intended to be limiting. For instance, the desired output voltage may be 1 volt and the actual output voltage at the output node 114 may vary by 1 microvolt or less.

In embodiments, the surface-mount capacitors 108 may be disposed over the interdigital capacitors 118. For example, the input surface-mount capacitors 108a may be disposed over the input interdigital capacitors 118a. By way of another example, the output surface-mount capacitors 108b may be disposed over the output interdigital capacitors 118b. Similarly, the interdigital capacitors 118 may be between the surface-mount capacitors 108 and the substrate 102. The surface-mount capacitor 108 may then be surface mounted to one or more portions of the interdigital capacitors 118.

The placement of the surface-mount capacitors 108 over the interdigital capacitors 118 may provide one or more functions. For example, the surface-mount capacitors 108 may be directly coupled in parallel across the interdigital capacitors 118. By way of another example, the package 100 may include the interdigital capacitors 118 with the low capacitance value for shunting away the high frequency noise with only a minimal increase in height of the package 100. In particular, the high frequency noise may be compensated for without increasing the footprint or form factor of the substrate 102. Additionally, the low capacitance value (on the order of nano-farads) may be in parallel or shunt with the large input and output capacitance values while on a single substrate (e.g., without an interposer or the like).

The interdigital capacitors 118 may be disposed on the substrate 102. The interdigital capacitors 118 may be planar. The interdigital capacitors 118 may include a height. For example, the interdigital capacitors 118 may include a height on the order of tens to hundreds of nanometers. The interdigital capacitors 118 may be much shorter than the surface-mount capacitor 108. In embodiments, the interdigital capacitors 118 may be one to two orders of magnitude shorter than the surface-mount capacitors 108. The interdigital capacitors 118 may be formed of conductive structures 122.

In embodiments, the package 100 may include one or more conductive structures 122. The conductive structures 122 may be electrically coupled to the input node 110, the ground plane 112, and/or the output node 114. For example, the conductive structures 122 may include an input conductive structure 122a electrically coupled to the input node 110. By way of another example, the conductive structures 122 may include a ground conductive structure 122b electrically coupled to the ground plane 112. By way of another example, the conductive structures 122 may include an output conductive structure 122c electrically coupled to the output node 114.

In embodiments, the conductive structures 122 may be formed of a conductive material (i.e., an electrically conductive material). The conductive material may be formed on the top surface of the substrate 102. For example, the conductive structure 122 may be formed of a metal material, such as, but not limited to, a gold material, a copper material, a silver material, a palladium material, and the like. In embodiments, the conductive structures 122 are fabricated by an additive manufacturing process, although this is not intended to be limiting. The additive manufacturing process may include growing the conductive structures 122 on the substrate 102 in one or more layers.

In embodiments, the conductive structures 122 may include a comb 124. The comb 124 may be disposed on the substrate 102. The comb 124 may also be referred to as a base or a terminal. For example, the comb 124 may include an input comb 124a. By way of another example, the comb 124 may include a ground comb 124b. By way of another example, the comb 124 may include an output comb 124c.

In embodiments, the conductive structures 122 may include a plurality of fingers 126. The fingers 126 may be disposed on the substrate 102. The fingers 126 may extend from the comb 124. For example, the fingers 126 may include input fingers 126a extending from the input comb 124a. By way of another example, the fingers 126 may include ground fingers 126b extending from the ground comb 124b. By way of another example, the fingers 126 may include output fingers 126c extending from the output comb 124c. For instance, the conductive structure 122b is depicted as including six of the ground fingers 126b and the conductive structure 122c is depicted as including five of the output fingers 126c, although this is not intended to be limiting. As may be understood, the number of the fingers 126 depicted is not intended to be limiting. The conductive structures 122 may include any number of the fingers 126.

The combs 124 and/or the fingers 126 may define the interdigital capacitors 118. The fingers 126 from one of the combs 124 may be interdigitated with fingers from another of the combs to form the interdigital capacitors 118. Interdigitated may also be referred to as interleaving. The interdigitated fingers are electrically separated from each other. The interdigitated fingers may be electrically separated by a gap. For example, the input fingers 126a may be interdigitated with the ground fingers 126b to form the input interdigital capacitor 118a. By way of another example, the ground fingers 126b may be interdigitated with the output fingers 126c to form the output interdigital capacitor 118b.

The fingers 126 may include a width, a length, and a height. The width of the fingers 126 may be inversely proportional to a density of the fingers 126 on the substrate 102. The height may be based on a layer thickness of a process used to fabricate the conductive structures 122 and a number of layers of the conductive structures 122. The combs 124 may also include a width, a length, and a height.

In embodiments, the capacitance value of the interdigital capacitor 118 may be based on one or more factors, such as, but not limited to, a width of the fingers 126, the gap distance between the fingers 126, the length of the fingers 126, the number of the fingers 126, a relative permittivity of the material between the fingers 126, and the like. Any of the various factors may be varied to achieve a desired capacitance value for the interdigital capacitor 118. In embodiments, the interdigital capacitor 118 includes the capacitance value on the order of nano-farads.

The surface-mount capacitors 108 may be electrically coupled in parallel with the interdigital capacitors 118 by coupling across the conductive structures 122. The surface-mount capacitors 108 may be electrically coupled across the conductive structures 122 by surface mounting to the comb 124 and/or the fingers 126. For example, the surface-mount capacitors 108 may be surface mounted to the comb 124 and/or the fingers 126 by solder (not depicted).

In embodiments, the package 100 includes the solder resist 120. The solder resist 120 may be disposed on and cover the interdigital capacitors 118. The solder resist 120 may also be disposed between the surface-mount capacitors 108 and the interdigital capacitors 118. Thus, the surface-mount capacitors 108 may be disposed above the interdigital capacitor 118 and above the solder resist 120 when surface mounted to the interdigital capacitor 118.

The solder resist 120 may define one or more openings 128. The openings 128 may include, but are not limited to, a rectangular opening, a circular opening, and the like. The openings may be through the solder resist 120 to the interdigital capacitor 118 and/or to conductive structures 122 defining the interdigital capacitors 118. For example, the openings 128 may include openings 128a to a conductive structure 122a electrically coupled to the input node 110 (not depicted in FIGS. 1A-1D). By way of another example, the openings 128 may include openings 128b to a conductive structure 122b coupled to the ground plane 112. By way of another example, the openings 128 may include openings 128c to a conductive structure 122c electrically coupled to the output node 114.

In embodiments, the surface-mount capacitors 108 may be surface mounted to the interdigital capacitors 118 through the openings 128. For example, solder may be disposed in the openings 128 and electrically couple the surface-mount capacitors 108 and the interdigital capacitors 118. The openings 128 may prevent the solder from shorting across the interdigital capacitors 118 (e.g., shorting between combs 124 and/or between fingers 126) during a reflow process. The surface-mount capacitors 108 may entirely cover the openings 128 when the surface-mount capacitors 108 are surface mounted to the interdigital capacitors 118.

In embodiments, the openings 128 in the solder resist 120 are provided for surface mounting the surface-mount capacitors 108 in parallel with the interdigital capacitors 118. The solder resist 120 may define at least two of the openings 128 for each of the surface-mount capacitors 108. A first of the at least two openings may allow the surface-mount capacitors 108 to electrically couple to a first conductive structure of the interdigital capacitors 118 and a second of the at least two openings may allow the surface-mount capacitors 108 to electrically couple to a second conductive structure of the interdigital capacitors 118. In this regard, the at least two openings may allow the surface-mount capacitors 108 to be electrically coupled in parallel across the interdigital capacitors 118.

For example, the solder resist 120 may define input openings 128a for coupling the input surface-mount capacitors 108a to the input conductive structure 122a (e.g., to the input comb 124a). By way of another example, the solder resist 120 may define ground openings 128b for coupling the input surface-mount capacitors 108a and/or the output surface-mount capacitors to the ground conductive structure 122b (e.g., to the ground comb 124b). By way of another example, the solder resist 120 may define output openings 128c for coupling the output surface-mount capacitors 108b to the output conductive structure 122c (e.g., to the output comb 124c).

In embodiments, the solder resist 120 is disposed between the fingers 126 of the interdigital capacitors 118. The solder resist 120 may include a relative permittivity (i.e., dielectric value). The relative permittivity may be higher than an air dielectric. Being disposed between the fingers 126 and including the relative permittivity may increase the capacitance value for the interdigital capacitors 118, as compared to the air dielectric. In some instances, the solder resist may increase the capacitance value for the interdigital capacitors 118 into the nano-farad range. For example, the solder resist 120 may be disposed between the fingers 126a and the fingers 126b. The solder resist 120 may then increase the capacitance value of the interdigital capacitors 118a. By way of another example, the solder resist 120 may be disposed between the fingers 126c and the fingers 126d. The solder resist 120 may then increase the capacitance value of the interdigital capacitors 118b.

In embodiments, the input node 110, the ground plane 112, and the output node 114 are disposed on a first surface (e.g., bottom surface) of the substrate 102. In this regard, the input node 110, the ground plane 112, and the output node 114 may be disposed below the substrate 102. In embodiments, the die 104, the surface-mount capacitors 108, and the interleaved capacitors 118 are disposed on a second surface (e.g., top surface) of the substrate 102. In this regard, the die 104, the surface-mount capacitors 108, and the interleaved capacitors 118 may be disposed above the substrate 102. The first surface and the second surface may be opposing surfaces of the substrate 102.

In embodiments, the package 100 may include the through vias 116. The through vias 116 may be provided through the substrate 102 from the first surface to the second surface. The through vias 116 may then electrically couple any of the various components of the package 100. For example, the through vias 116 may include through vias 116a, through vias 116b, through vias 116a, and/or through vias 116d. As may be understood, the number and placement of the through vias 116 depicted in the figures is not intended to be limiting.

The through vias 116a may electrically couple the die 104 to the input node 110. In this regard, the die 104 may receive the input power. The through vias 116b may electrically couple the die 104 to the ground plane 112. In this regard, the die 104 may be at ground potential, although this is not intended to be limiting. The through vias 116c may electrically couple the surface-mount capacitor 108 (e.g., input surface-mount capacitor 108a, output surface-mount capacitor 108b) and/or the interdigital capacitor 118 (e.g., input interdigital capacitor 118a, output interdigital capacitor 118b) to the ground plane 112. For example, the through vias 116c may electrically couple the input surface-mount capacitors 108a, output surface-mount capacitors 108b, input interdigital capacitors 118a, and/or the output interdigital capacitors 118b to the ground plane 112 by the conductive structure 122. The through vias 116d may electrically couple the surface-mount capacitor 108 (e.g., output surface-mount capacitor 108b) and/or the interdigital capacitor 118 (e.g., output interdigital capacitor 118b) to the output node 114. For example, the through vias 116d may electrically couple the output surface-mount capacitor 108b and/or the output interdigital capacitors 118b to the output node 114 by the conductive structure 122c. The through vias 116e may electrically couple the surface-mount capacitor 108 (e.g., input surface-mount capacitors 108a) and/or the interdigital capacitor 118 (e.g., input interdigital capacitor 118a) to the input node 110. For example, the through vias 116e may electrically couple the input surface-mount capacitors 108a and/or the input interdigital capacitors 118a to the input node 110 by the conductive structure 122a.

In embodiments, the through vias 116 coupling the surface-mount capacitors 108 and/or the interdigital capacitors 118 to the input node 110, the ground plane 112, and/or the output node 114 may be provided on the comb 124. For example, the through vias 116c may be electrically coupled between the ground plane 112 and the comb 124b. By way of another example, the through vias 116d may be electrically coupled between the output node 114 and the comb 124c. By way of another example, the through vias 116e may be electrically coupled between the input node 110 and the comb 124a.

Although the through vias 116 are described as being electrically coupled to the comb 124, this is not intended as a limitation of the present disclosure. In embodiments, the through vias 116 may be electrically coupled to one or more the fingers 126. However, a limiting factor may be a minimum via size (e.g., determined by a minimum drill size together with a minimum fill diameter). In embodiments, the through vias 116 may be up to the wall of the lid 106. The through vias 116 may then be electrically coupled from the wall of the lid 106 to the surface-mount capacitor 108 and/or the interdigital capacitor 118 by a trace or the like.

As depicted, the input node 110 and the output node 114 may be disposed on opposite sides of the package 100, although this is not intended to be limiting. The input node 110 and the output node 114 may be electrically separated. For example, the input node 110 and the output node 114 may be electrically separated by the ground plane 112, although this is not intended to be limiting.

Referring now to FIGS. 2A-2D, a package 200 is described, in accordance with one or more embodiments of the present disclosure. The discussion of the package 100 is incorporated herein by reference in the entirety as to the package 100.

The package 200 may include the input surface-mount capacitors 108a and the output surface-mount capacitors 108b. For example, the package 200 is depicted as including ten of the input surface-mount capacitors 108a and ten of the output surface-mount capacitors 108b. The number of the input and output surface-mount capacitors depicted is not intended to be limiting. The number may be based on the size of the package 200, the capacitance value of the surface-mount capacitor, and the like. The number and capacitance value of the input surface-mount capacitors 108a and the output surface-mount capacitors 108b may or may not be symmetrical.

In embodiments, the input surface-mount capacitors 108a and the output surface-mount capacitors 108b are arranged around the perimeter of the die 104. The input surface-mount capacitors 108a and the output surface-mount capacitors 108b may be disposed around all sides of the die 104 and/or the lid 106. For example, the input surface-mount capacitors 108a are depicted as being disposed around the top side, left side, and bottom side of the die 104 and/or the lid 106. By way of another example, the output surface-mount capacitors are depicted as being disposed around the top side, right side, and bottom side of the die 104 and/or the lid 106.

The package 200 may also include the input interdigital capacitor 118a and the and the output interdigital capacitor 118b. The input conductive structure 122a and the ground conductive structure 122b form the input interdigital capacitor 118a. The ground conductive structure 122b and the output conductive structure 122c form the output interdigital capacitor 118b.

The input conductive structure 122a, the ground conductive structure 122b, and the output conductive structure 122c may include any number of the fingers 126 interdigitated to form the interdigital capacitors 118. The number of the fingers 126 in the input interdigital capacitor 118a and the output interdigital capacitor 118b is not intended to be limiting. The number may be based on the size of the package 200, the capacitance value of the interdigital capacitor 118, and the like. For example, the package 200 is depicted as including the input interdigital capacitor 118a formed from thirty of the input fingers 126a interdigitated with twenty-nine of the ground fingers 126b. By way of another example, the package 200 is depicted as including the output interdigital capacitor 118b formed from thirty of the output fingers 126c interdigitated with twenty-nine of the ground fingers 126b. In this regard, the ground structure 122b is depicted with a total of fifty-eight of the ground fingers 126b extending from the ground comb 124b. In this regard, the ground conductive structure 122b may include a first set of the ground fingers 126b which are interdigitated with the input fingers 126a and a second set of the ground fingers 126b which are interdigitated with the output fingers 126c.

In embodiments, the input interdigital capacitor 118a and the output interdigital capacitor 118b are arranged around a perimeter of the die 104. In embodiments, the combs 124 may be disposed around the die 104, the lid 106, and/or a center of the substrate 102. For example, the ground comb 124b is depicted disposed around the die 104, the lid 106, and the center of the substrate 102. The ground comb 124b may be disposed around all sides of the die 104 and/or the lid 106.

In embodiments, the combs 124 may extend around one or more sides of the substrate 102. The comb 124 may extend around a top side, a right side, a bottom side, and/or a left side of the substrate 102. For example, the input comb 124a is depicted extending along the top side, left side, and bottom side. By way of another example, the output comb 124c is depicted along the top side, right side, and bottom side.

The fingers 126 may extend from each of the portions of the combs 124. For example, the input fingers 126a are depicted with five extending from the top side of the input comb 124a, twenty extending from the left side of the input comb 124a, and five extending from the bottom side of the input comb 124a. By way of another example, the ground fingers 126b are depicted with eight extending from the top side of the ground comb 124b, twenty-one extending from the right side of the ground comb 124b, eight extending from the bottom side of the ground comb 124b, and twenty-one extending from the left side of the ground comb 124b. By way of another example, the output fingers 126c are depicted with five extending from the top side of the output comb 124c, twenty extending from the right side of the output comb 124c, and five extending from the bottom side of the output comb 124c.

In embodiments, a center of the die 104 is aligned with the center of the substrate 102. The alignment may be beneficial to provide symmetry between the input surface-mount capacitors 108a and the output surface-mount capacitors 108b and/or between the input interdigital capacitors 118a and the output interdigital capacitors 118b. Although the center of the die 104 has been described as being aligned with the center of the substrate 102, this is not intended as a limitation of the present disclosure. The center of the die 104 may also be shifted or offset from the center of the substrate 102.

In embodiments, the input surface-mount capacitors 108a and the output surface-mount capacitors 108b are symmetric with respect to the center of the die 104. The symmetry may indicate a number of, capacitance value, size position, and the like between the input surface-mount capacitors 108a and the output surface-mount capacitors 108b. The symmetry may allow the package 200 to include a matching number of the input surface-mount capacitors 108a and the output-surface mount capacitors 108b. In this regard, the circuit formed by the input surface-mount capacitors 108a, the die 104, and the output-surface mount capacitors 108b may include a matched input and output capacitance.

In embodiments, the input interdigital capacitors 118a and the output interdigital capacitors 118b are symmetric with respect to the center of the die 104. The symmetry may indicate input interdigital capacitors 118a and the output interdigital capacitors 118b include a matching capacitance value, number of fingers, length, width, and the like. The symmetry may provide a method to accommodate for thermal expansion of the interdigital capacitors 118 and/or the substrate 102. The package 200 may include a matching number of the fingers 126 forming the input interdigital capacitors 118a and the output interdigital capacitors 118b. In this regard, the input interdigital capacitors 118a and the output interdigital capacitors 118b may include a matched capacitance value.

In some embodiments, the ground comb 124*b* may include corners 202. The ground fingers 126*b* may extend from the corners 202 in one direction, but not in two directions. The corners 202 may be separated from and form a capacitor with the input comb 124*a* and/or the output comb 124*b*. For example, the ground comb 124*b* may include corners 202*a* separated from and forming a capacitor with the input comb 124*a*. By way of another example, the ground comb 124*b* may include corners 202*b* separated from and forming a capacitor with the output comb 124*c*.

In some embodiments, the ground vias 116*c* may be disposed in the corners 202, although this is not intended to be limiting. The ground vias 116*c* may also be disposed at positions along the ground comb 124*b*, the ground fingers 126*b*, and the like.

Figure 3A:
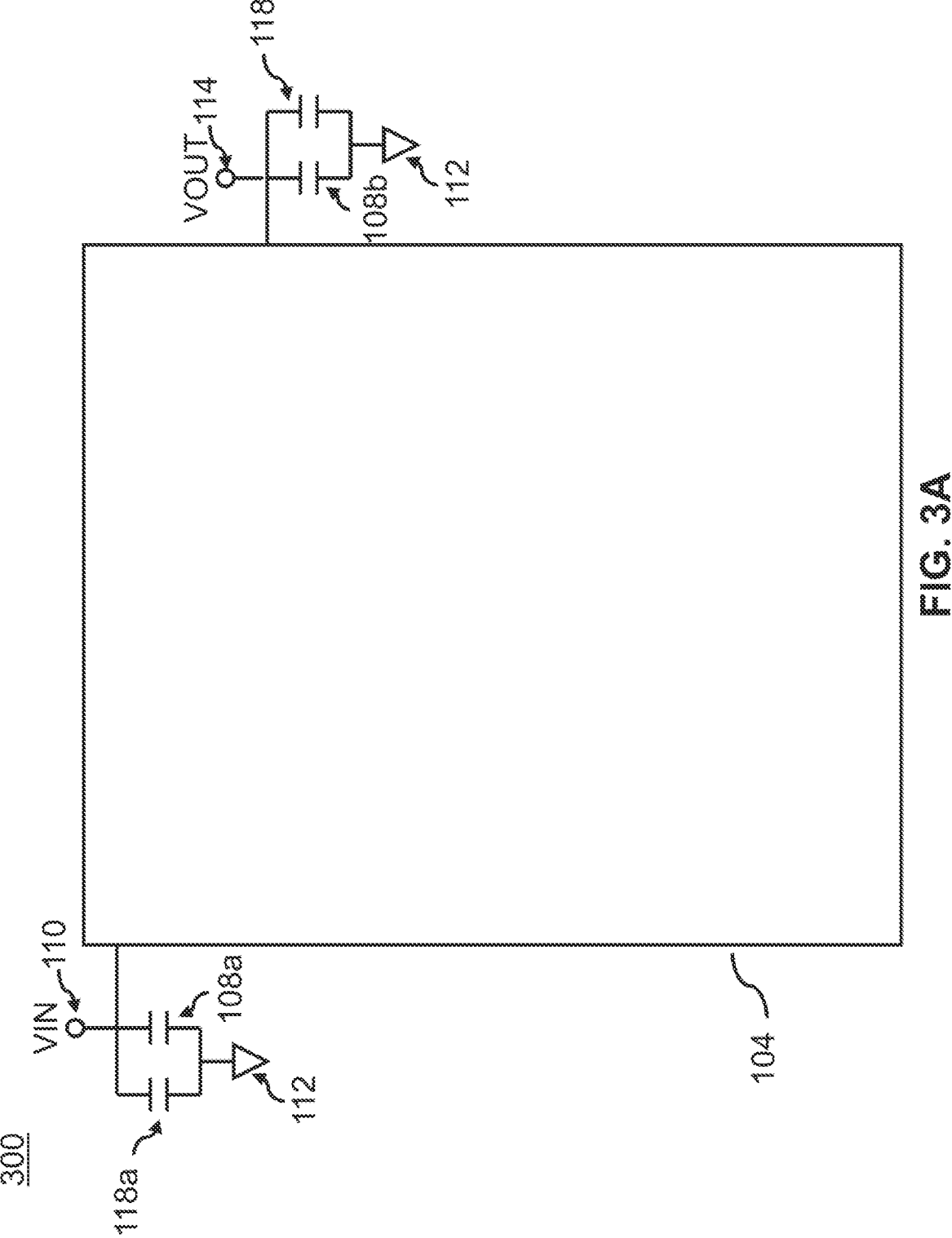
FIG. 3A depicts a circuit diagram including interdigital capacitors represented as single lumped element capacitor symbols and surface-mount capacitors also represented as single lumped element symbols, that are coupled in parallel, and present at the input and at the output of the circuit, in accordance with one or more embodiments of the present disclosure.
Figure 3B:
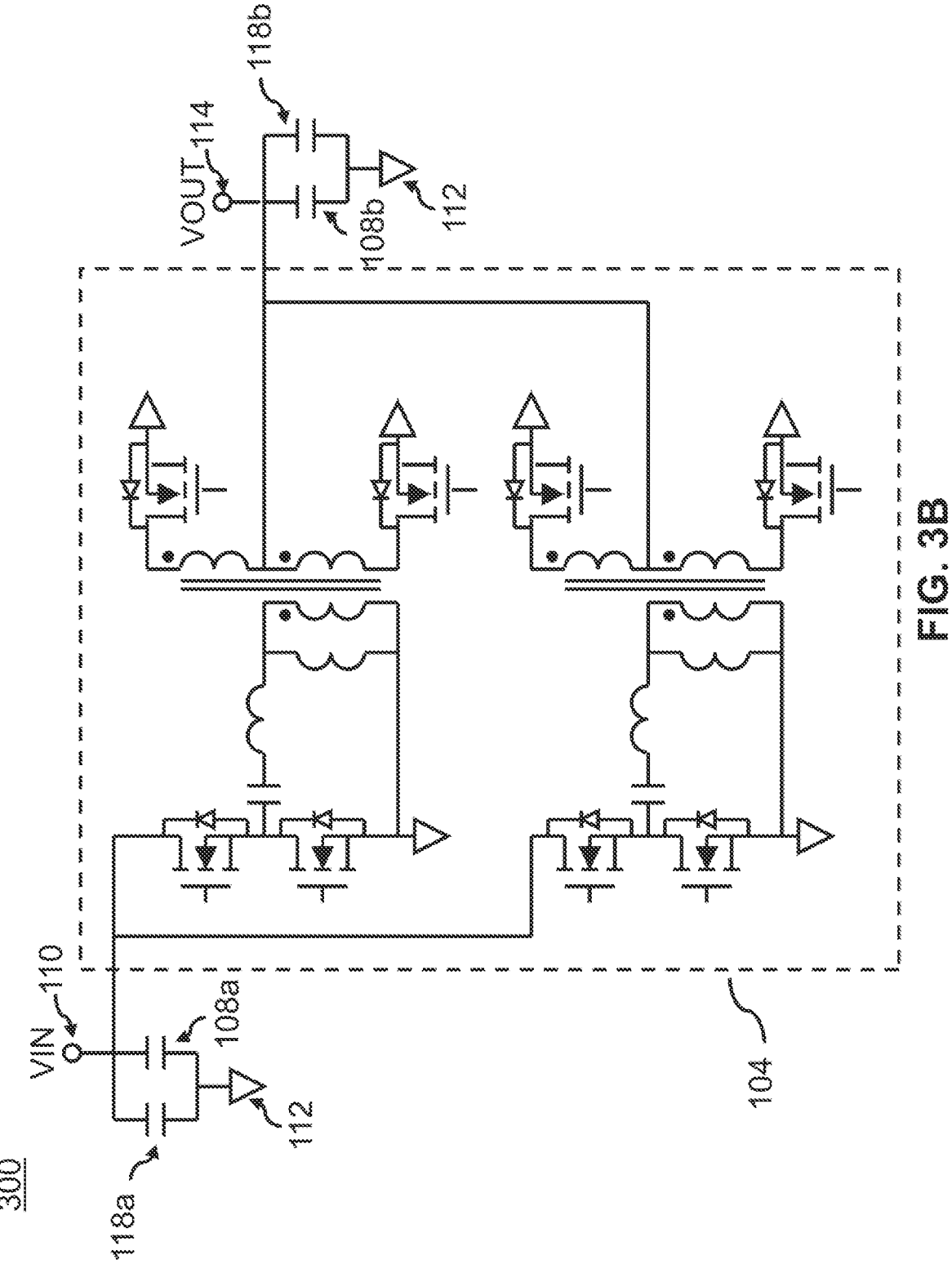
FIG. 3B depicts a circuit diagram including interdigital capacitors shown as single lumped element symbols and surface-mount capacitors shown as single lumped element symbols coupled in parallel with an exemplary schematic of a POL semiconductor die, in accordance with one or more embodiments of the present disclosure.

Referring now to FIGS. 3A-3B, a circuit 300 is described, in accordance with one or more embodiments of the present disclosure. The circuit 300 may provide a circuit diagram for the package 100 and/or the package 200.

The circuit 300 may include the input node 110, the input surface-mount capacitor 108*a*, the input interdigital capacitor 118*a*, the ground plane 112, the die 104, the output node 114, the output surface-mount capacitor 108*b*, the output interdigital capacitor 118*b*, and the like.

Referring now to FIG. 3B, an example circuit of the die 104 is described. The example circuit of the die 104 may be referred to as the power conditioning circuit. The power conditioning circuit may condition the voltage output (VOUT). The power conditioning circuit may include a number of FETs, series capacitors, inductors, transformers, and the like. The specifics of the power conditioning circuit are not intended to be limiting but merely illustrative. The power conditioning circuit may be considered active because of the FETs. The power conditioning circuit may be considered radiation tolerant or radiation hardened because of the lid 106. The power conditioning circuit may make the output voltage extremely stable. For example, the output voltage may vary by 1 microvolt or less.

Referring generally again to FIGS. 1A-3B. From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. A package comprising:
a substrate;
a ground plane;
an input node;
an output node;
a die electrically coupled between the input node and the output node;
a first conductive structure electrically coupled to the ground plane; wherein the first conductive structure comprises a first comb and a first plurality of fingers; wherein the first plurality of fingers each extend from the first comb; wherein the first comb and the first plurality of fingers are disposed on the substrate;
a second conductive structure electrically coupled to the output node; wherein the second conductive structure comprises a second comb and a second plurality of fingers; wherein the second plurality of fingers each extend from the second comb; wherein the second comb and the second plurality of fingers are disposed on the substrate;
wherein the first plurality of fingers is interdigitated with the second plurality of fingers to form a first interdigital capacitor;
a solder resist disposed on the first conductive structure and on the second conductive structure; wherein the solder resist is disposed between the first plurality of fingers and the second plurality of fingers;
a first surface-mount capacitor disposed on the solder resist; wherein the first surface-mount capacitor is electrically coupled in parallel with the first interdigital capacitor between the output node and the ground plane; wherein the first surface-mount capacitor is one of a first plurality of surface-mount capacitors disposed on the solder resist and electrically coupled in parallel with the first interdigital capacitor between the output node and the ground plane;
a third conductive structure electrically coupled to the input node; wherein the third conductive structure comprises a third comb and a third plurality of fingers; wherein the third plurality of fingers each extend from the third comb; wherein the third comb and the third plurality of fingers are disposed on the substrate;
wherein the first conductive structure comprises a fourth plurality of fingers; wherein the fourth plurality of fingers each extend from the first comb; wherein the fourth plurality of fingers are disposed on the substrate;
wherein the third plurality of fingers are interdigitated with the fourth plurality of fingers to form a second interdigital capacitor; and
a second plurality of surface-mount capacitors disposed on the solder resist;
wherein the second plurality of surface-mount capacitors are electrically coupled in parallel with the second interdigital capacitor between the input node and the ground plane.

2. The package of claim 1, wherein the first interdigital capacitor has a first capacitance value; wherein the first surface-mount capacitor has a second capacitance value; wherein the first capacitance value is less than the second capacitance value.

3. The package of claim 2, wherein the solder resist has a relative permittivity; wherein the first capacitance value is based on the relative permittivity.

4. The package of claim 3, wherein the first capacitance value is between one and ten nano-farads.

5. The package of claim 1, wherein the first surface-mount capacitor is electrically coupled to the ground plane by surface mounting to the first comb; wherein the first surface-mount capacitor is electrically coupled to the output node by surface mounting to the second comb.

6. The package of claim 5, wherein the solder resist defines openings for surface mounting the first surface-mount capacitor to the first comb and to the second comb.

7. The package of claim 1, wherein the first surface-mount capacitor is disposed above the first plurality of fingers and above the second plurality of fingers.

8. The package of claim 1, wherein the first conductive structure is electrically coupled to the ground plane by one or more through vias.

9. The package of claim 1, wherein the output node is disposed below the substrate; wherein the second conductive structure is electrically coupled to the output node by one or more through vias.

10. The package of claim 1, wherein the substrate comprises one of an alumina wafer, a sapphire wafer, a glass wafer, a silicon wafer, an aluminum nitride wafer, or a beryllium oxide wafer.

11. The package of claim 1, wherein the first conductive structure and the second conductive structure comprises one of a gold material, a copper material, a silver material, or a palladium material.

12. The package of claim 1, wherein the input node comprises a first voltage; wherein the output node comprises a second voltage; wherein the first voltage is greater than the second voltage.

13. The package of claim 12, comprising a lid; wherein the lid is disposed over the die; wherein the lid hermetically seals the die; wherein the lid is configured to radiation harden the die.

14. The package of claim 13, wherein the first plurality of surface-mount capacitors and the second plurality of surface-mount capacitors are disposed outside of the lid.

15. The package of claim 1, wherein a center of the die is aligned with a center of the substrate.

16. The package of claim 15, wherein the first interdigital capacitor and the second interdigital capacitor are symmetric with respect to the center of the die; wherein the first plurality of surface-mount capacitors and the second plurality of surface-mount capacitors are symmetric with respect to the center of the die.

17. The package of claim 16, wherein the first interdigital capacitor and the second interdigital capacitor are arranged around a perimeter of the die; wherein the first plurality of surface-mount capacitors and the second plurality of surface-mount capacitors are arranged around the perimeter of the die.

* * * * *